(12) United States Patent
Schmidt

(10) Patent No.: US 6,710,424 B2
(45) Date of Patent: Mar. 23, 2004

(54) RF CHIPSET ARCHITECTURE

(75) Inventor: Dominik J. Schmidt, Palo Alto, CA (US)

(73) Assignee: AirIP, Palo Alto, CA (US)

( * ) Notice: Subject to any disclaimer, the term of this patent is extended or adjusted under 35 U.S.C. 154(b) by 0 days.

(21) Appl. No.: 09/962,717

(22) Filed: Sep. 21, 2001

(65) Prior Publication Data

US 2003/0057429 A1 Mar. 27, 2003

(51) Int. Cl.[7] .................. H01L 29/00; H01L 29/93; H04M 1/00
(52) U.S. Cl. .............. 257/531; 257/601; 455/552.1
(58) Field of Search ................. 257/531, 601, 257/728; 438/51, 305; 455/552.1, 168.1

(56) References Cited

U.S. PATENT DOCUMENTS

| | | | | |
|---|---|---|---|---|
| 5,898,235 A | * | 4/1999 | McClure | 307/64 |
| 6,087,198 A | * | 7/2000 | Panasik | 438/51 |
| 6,125,268 A | * | 9/2000 | Boesch et al. | 455/168.1 |
| 6,380,835 B1 | * | 4/2002 | Lee | 336/200 |
| 6,400,001 B1 | * | 6/2002 | Manzini et al. | 257/601 |
| 6,407,441 B1 | * | 6/2002 | Yuan | 257/531 |
| 6,477,606 B1 | * | 11/2002 | Kawamura et al. | 710/305 |
| 6,484,038 B1 | * | 11/2002 | Gore et al. | 455/552.1 |
| 6,548,942 B1 | * | 4/2003 | Panasik | 310/364 |
| 6,627,507 B2 | * | 9/2003 | Yuan | 257/531 |
| 6,627,992 B2 | * | 9/2003 | Ammar | 257/728 |

* cited by examiner

Primary Examiner—John F. Niebling
Assistant Examiner—Walter L Lindsay, Jr.
(74) Attorney, Agent, or Firm—Tran & Associates

(57) ABSTRACT

A set of radio frequency (RF) integrated circuits includes a transmit chip having a power amplifier and a receive chip adapted to work with the transmit chip. The receive chip has one or more low noise amplifiers to receive RF signals, and a processor coupled to the low noise amplifiers, the processor transmitting data through the transmit chip and receiving data from the on-chip low noise amplifiers.

16 Claims, 3 Drawing Sheets

RF CHIPSET ARCHITECTURE

BACKGROUND

This invention relates to the field of wireless integrated circuits.

The demand for low-cost, reliable wireless communications continues to increase at a rapid rate, as do the demands on the technologies enabling such communications. Chip designers work on many fronts to find ways to make the circuitry found inside devices such as cellular phones smaller, cheaper, easier to fabricate, less power-hungry, and more reliable.

One major component in a cellular phone is a radio frequency (RF) transceiver. U.S. Pat. No. 6,049,702 shows a block diagram of the RF/analog and analog/digital (A/D) interface circuitry of a basic transceiver, which can be combined with other components (not shown) to form a complete transceiver. The transmitter portion of the transceiver includes digital-to-analog converters (DACs), low-pass filters for filtering the outputs of DACs, respectively, and a modulator that performs a frequency conversion on signals received at its inputs and which is driven by a phase-locked loop (PLL) circuit that includes a reference voltage-controlled-oscillator (VCO) and a resonator (tank circuit). The modulator's output is fed to a power amplifier, and the amplified output is fed to one side of a transmit/receive (T/R) switch, filtered with a bandpass filter, and connected to an antenna.

The receiver portion is connected to the other side of T/R switch. Incoming signals are received by the antenna and filtered by the bandpass filter before being fed to a low-noise amplifier (LNA)/demodulator circuit. The output of the circuit's LNA is passed through a bandpass filter before being fed to a demodulator which performs a frequency conversion on the signal received by antenna. The demodulator is driven by a PLL circuit which includes a reference VCO and a tank circuit. The demodulator output drives an intermediate-frequency automatic gain control (IF AGC) stage, with a bandpass filter interposed between the stage's IF amplifier and its AGC circuitry. The AGC output is fed to an IF demodulator which is driven by a PLL circuit that includes a reference VCO and a tank circuit. The IF demodulator's two outputs are passed through respective low-pass filters before being fed to respective analog-to-digital converters (ADCs).

Current RF transceivers are implemented using a variety of device technologies For example, DACs, ADCs, and all other digital baseband transceiver circuitry are typically CMOS circuits. The modulator, LNA/demodulator, IF/AGC stage, and IF demodulator generally use bipolar junction transistors (BJTs). The power amplifier can be fabricated on a gallium arsenide (GaAs) substrate, particularly for a high-power application such as a cellular phone Bandpass, low-pass filters, as well as tank circuits, and antenna are generally built with discrete components. T/R switch is also typically made from discrete components, or are made from costly, complex PIN diode circuits if integrated.

Because a variety of technologies must be combined, current transceivers typically requires multiple integrated circuits (IC). For example, a CDMA or WCDMA RF front end typically consists of two ICs. There is a receive IC and a transmit IC, which need to be on separate pieces of silicon to isolate the low power received signal (around 10 mW) from the high power send signal (around 300 mW). With a processor IC to control the RF front-end, the electronic of an RF system requires three chips: a processor IC, a receive IC, and a transmit IC. These ICs add cost and can result in an assembly is typically larger than is desired, particularly when the limited space and weight requirements imposed on designers of battery-powered handheld devices must be met.

SUMMARY

In one aspect, a set of radio frequency (RF) integrated circuits includes a transmit chip having a power amplifier and a receive chip adapted to work with the transmit chip. The receive chip has one or more low noise amplifiers to receive RF signals, and a processor coupled to the low noise amplifiers, the processor transmitting data through the transmit chip and receiving data from the on-chip low noise amplifiers.

In another aspect, a radio frequency transceiver system includes a transmit chip; and a receive chip having a transistor device. The transistor device includes a layer of gate oxide on a surface of the semiconductor substrate, a gate electrode formed on the surface of the gate oxide, the gate electrode having a drain side; a p-well implanted within a semiconductor substrate under the gate electrode; an n-well implanted in the p-well on the drain side; an n+ source region in the p-well outside of the n-well; an n+ drain region within the substrate inside the n-well; and lightly doped regions extending respectively from the source and drain regions toward the gate electrode.

Implementations of the device may include one or more of the following. The n-well extends slightly under the gate electrode. The p-well is deeper than the n-well. A second device can be fabricated adjacent the first device with a second gate electrode formed on the surface of the gate oxide; a second n-well implanted within a semiconductor substrate under the second gate electrode; a p+ source region in the second n-well; and a p+ drain region within the substrate inside the second n-well The second n-well is adjacent the p-well. The first and second n-wells are formed at the same time. The device can be used in digital circuits that operate next to sensitive analog circuits such as CMOS imaging elements, precision analog-digital converters, or radio frequency circuits In another aspect, a method for manufacturing a two-chip radio frequency transceiver system with a receive chip having a transistor device. The transistor device a metal oxide semiconductor transistor device includes implanting a p-well in a substrate; implanting an n-well in the p-well; growing a gate oxide above the p-well; forming a polysilicon layer on the gate oxide; implanting a p+ region in the substrate; and implanting an n+ region in the substrate.

Implementations of the above aspect may include one or more of the following. The method includes forming lightly doped regions extending respectively from the source and drain regions toward the gate electrode. The method also includes forming an isolation layer between the substrate and the gate oxide. The method includes patterning the polysilicon layer. The method also includes patterning the p+ region and the n+ region. The method forms robust devices that can used in digital circuitry adjacent analog circuitry. The analog circuit can be imaging elements, analog to digital converters or a radio frequency circuits, among others.

Advantages of the device can include one or more of the following. The system is a 2 chip solution instead of a 3 chip solution, saving weight, cost, and board real-estate. These advantages are important for mobile applications such as handheld computers and cellular telephones, among others. The baseband chip has several process steps that can be used to enhance the performance of a low-power RF detector. For example, as discussed below, the circuits use implants that can reduce hot electrons, and also a very thin oxide layer that can be used to make low voltage high performance transistors. The system also uses reliable and inexpensive MOS- FETs. The MOSFETs can be used in mixed-mode integrated circuits (ICs) that include both digital and analog circuits on a single chip. The device reduces the magnitude of electric field seen along the channel near the drain of an MOS device, especially in digital transistors which switch at high frequency. The device also avoids the hot electron injection problem without creating sharp curvatures on the junction and without an additional long drive-in time that can cause undesired thermal effects in the other parts of the device. The resultant low junction curvature increases the breakdown voltage, making it possible to operate the transistor at higher biases without catastrophic failure. The inventive process also forms source/drain regions having low series resistance and a large junction radius, and which does not require additional masking or heating steps.

BRIEF DESCRIPTION OF THE DRAWINGS

The following detailed description of the embodiments can best be understood when read in conjunction with the following drawings, in which.

DESCRIPTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

In one embodiment, an RF transceiver solution is provided using only two chips: one chip (transmit chip) contains high power transmit circuitry, while the second chip (baseband chip) contains low power RF signal receive/sense circuit, a digital processor and related logic circuits.

Figure 1:
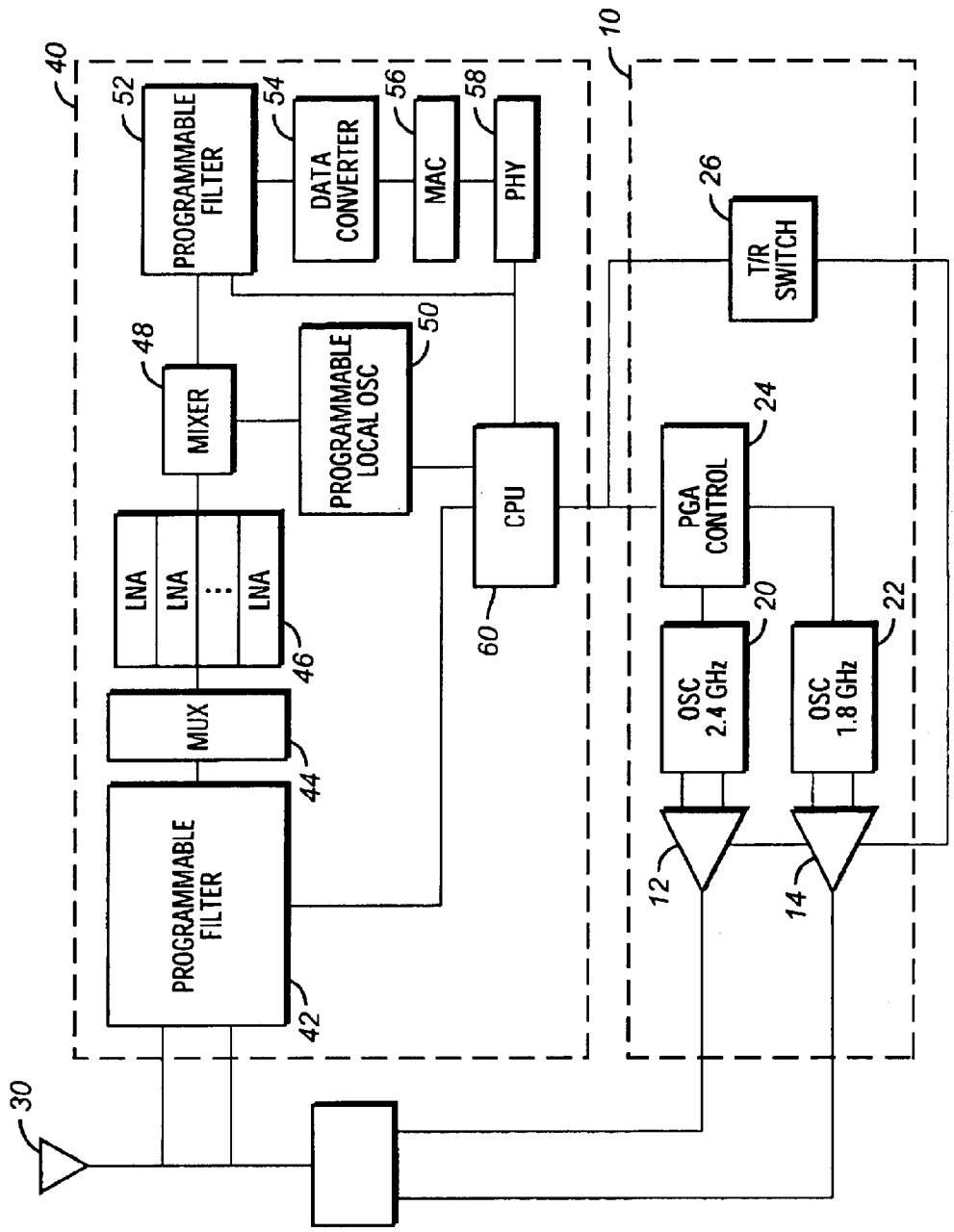
FIG. 1 shows a two chip set of radio frequency (RF) integrated circuits.

FIG. 1 shows a two chip set of radio frequency (RF) integrated circuits includes a transmit chip 10 having power amplifiers 12 and 14 whose outputs are connected to an antenna switch 16 that in turn is connected to an antenna 30. The power amplifiers 12 and 14 are connected to oscillators 20 and 22 that provide RF signals for each RF protocol that the transmitter handles. For instance, a 2.4 GHz oscillator is used as the oscillator 20, while a 1.8 GHz oscillator is used as the oscillator 22. The oscillators 20 and 22 in turn is controlled by a programmable gain adjustment (PGA) circuit 24. The power amplifiers 12 and 14 are also enabled or disabled by a transmit/receive switch 26. The PGA 24 and the switch 26 are connected to a processor 60 in a receive chip 40.

The receive chip 40 is adapted to work with the transmit chip. The receive chip 40 receives signals from the antenna 30 through a digitally programmable filter 42 The output of the filter 42 is provided to a multiplexer switch 44. The RF signal is routed through the multiplexer switch 44 to one or more low noise amplifiers 46, whose outputs are provided to a mixer 48. The mixer receives reference signals from a programmable local oscillator 50. The output of the mixer 48 is provided to a second digitally programmable filter 52 and is digitized by a data conversion circuit 54. The digitized signal is provided to a MAC 56 and a PHY 58. The PHY 58 in turn communicates with the processor 60 The processor 60 is connected to all blocks on the receive chip 40 and to the PGA circuit 24 and transmit receive switch 26 on the transmit chip 10.

One embodiment uses CMOS transistors which at 0.1 um are reaching Q factors of 10 or more, so good resonators can be built with these transistors. The baseband chip has several process steps that can be used to enhance the performance of a low-power RF detector. For example, as discussed below, the circuits use implants that can reduce hot electrons, and also a very thin oxide layer that can be used to make low voltage high performance transistors. The end result is a 2 chip solution instead of a 3 chip solution.

Figure 2:
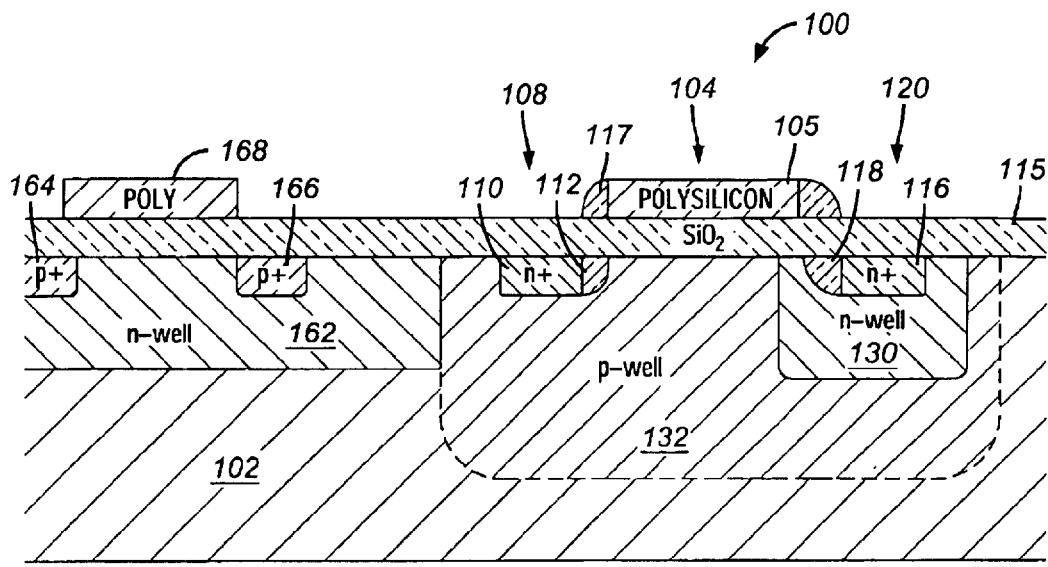
FIG. 2 illustrates an exemplary completed MOSFET structure.

FIG. 2 illustrates one FET of a large scale integrated circuit fabricated in accordance with the process of the present invention, the FET device being generally identified by the reference numeral 100. The substrate region 102 of the device is a silicon material lightly doped with a p-type material, such as boron, and designated as a p-substrate. A gate 104 is separated from the silicon substrate 102 by a layer of silicon dioxide 1115. A channel region above the p-substrate region 102 and below the gate 104 is slightly more heavily doped p-type material than substrate 102 and is designated as a p-well 132. A source 108 and drain 120 are formed by heavily doping a region of the p-well 132 on opposite sides of the gate 104 with an n-type material and designated as a n+ regions 110 and 116. Lightly doped drain (LDD) structures 112 and 118, created by implanting shallow n−, forming oxide spacers 117 adjacent to the polysilicon layer 105, and implanting the n+. The n+ region 116 and its LDD structure 118 are placed in an n-well 130. The n-well 130 in turn is positioned in a p-well 132. The n+ region 110 and its LDD 112 are also positioned in the p-well 132. This device is known as an NMOS device and it is this device that suffers from hot electron injection.

The p-well 132 is adjacent to an n-well 162, which contains two p+ regions 164 and 166. A polysilicon layer 168 is deposited above the silicon dioxide layer 115 to form a gate. The layer of polysilicon material is next implanted with phosphorous, an N-type material. The layer of polysilicon material implanted with phosphorous is then oxidized with a layer of silicon dioxide. This device is commonly known as a PMOS device, and it typically does not suffer from hot electron problems.

Figure 3:
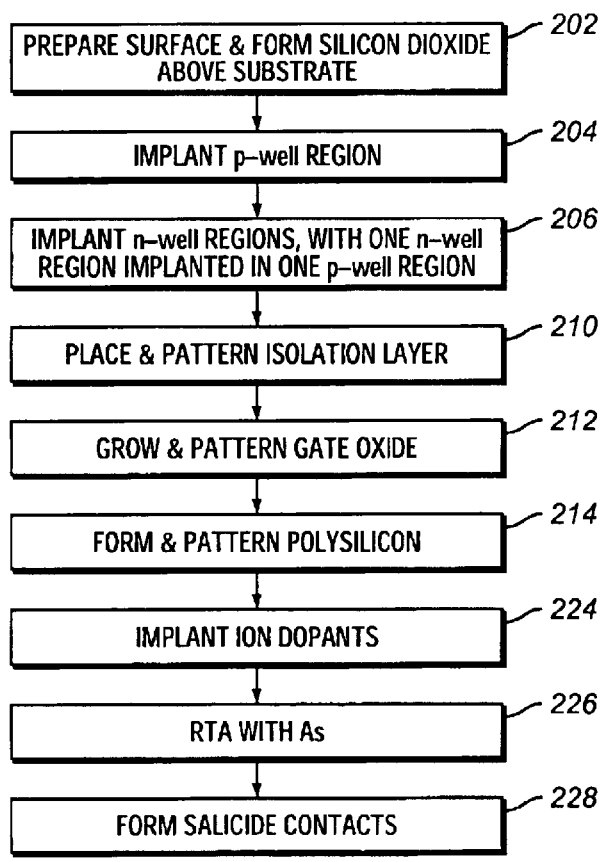
FIG. 3 shows an exemplary process for making an MOSFET with a highly scalable conduction channel length.

FIG. 3 shows an exemplary method 200 for fabricating the FET of FIG. 2. First, the silicon surface is prepared and the layer of silicon dioxide 115, approximately 80 angstroms thick, is grown atop the substrate 102 (step 202). Next, p-well regions are implanted (step 204). Next, n-well regions are implanted in the surface (step 206). In particular, the p-well regions are deeper than the n-well regions and one n-well region is implanted within one of the p-well regions.

An isolation layer is placed and patterned (step 210). A gate oxide is grown and patterned (step 212). The gate oxide layer 115 can be formed through any suitable process, such as by chemical vapor deposition (CVD). In an alternative embodiment, the gate oxide is thermally grown on the substrate 102. Next, the polysilicon layer 115 is formed and patterned (step 214). The layer of undoped polysilicon is deposited on the top surface of gate oxide 104 and can be deposited by any suitable method, such as by CVD. The upper surface of the structure can be planarized through chemical mechanical polishing (CMP). The patterning process involves photoresist is deposited as a continuous layer on polysilicon and selectively irradiated using a photolithographic system, such as a step and repeat optical projection system, in which I-line ultraviolet light from a mercury-vapor lamp is projected through a first reticle and a focusing lens to obtain an image pattern. Thereafter, the photoresist is developed and the irradiated portions of the photoresist are removed to provide openings in photoresist. The openings expose portions of polysilicon layer to an etch, thereby defining a gate region. An anisotropic etch is applied that removes the exposed portions of polysilicon 105. Various etchants can be used to anisotropically etch or to selectively remove the polysilicon and oxide layers. After the etching step or steps, the gate region 104 remains. The gate region 104 includes: the polysilicon layer 105 on top of the gate oxide 115 on top of the substrate 102. The photoresist is stripped, using conventional photoresist stripping techniques.

The source region 108 and a drain region 120 are provided by implanting ion dopants into the top of the substrate 102 (step 224). The ion implantation uses conventional ion implanting techniques. In one embodiment, the source and drain LDD regions 112 and 118 respectively, include the phosphorous-doped silicon material. The gate 104 behaves as an implant mask and provides for self-aligned source and drain LDD regions, 112 and 118 respectively. The p+ region is also placed using conventional process.

Next, a high temperature rapid thermal anneal (RTA) is conducted in the presence of Arsenic (As) gas (step 226). This process cures out the crystal damage induced by the previous ion implant process. Additionally, the annealing step is performed in the presence of As gas. The presence of the As gas causes an additional doping implantation into the substrate 102. An oxide layer is subsequently deposited and etched anisotropically, resulting in spacers 117 next to the poly gate 105. The n+ source/drain regions 110 and 116, are formed in the pwell 132, next to the spacers 117, in the region where the gate oxide 115 has been etched back These highly doped regions form electrical connections to the drain/source electrodes, 108 and 120 respectively.

Next, salicide contacts are formed on the gate 104, source 108, drain 120 and lightly doped regions 112 and 118 (step 228). Additionally contact formation, not included here, is achieved using conventional techniques. These further processing steps are not repeated herein. Likewise, the principal processing steps disclosed herein may be combined with other steps apparent to those skilled in the art.

The application of the extra nwell region around the drain of the NMOS transistor reduces hot electron effects by reducing the electric field in the pinch-off region. The electric field is proportional to the voltage drop across the pinch-off region divided by the length of the pinch-off region. The nwell region extends laterally with a smooth decrease in doping, so that part of the drain voltage is dropped across the nwell region. Also, the pinchoff region is extended somewhat because the channel is counterdoped, resulting in lower doping in the pinchoff area, which in turn increases the pinchoff length. The field is therefore significantly reduced, and since the hot electron current depends exponentially on the field, there is a very large corresponding decrease in this current.

Figure 4:
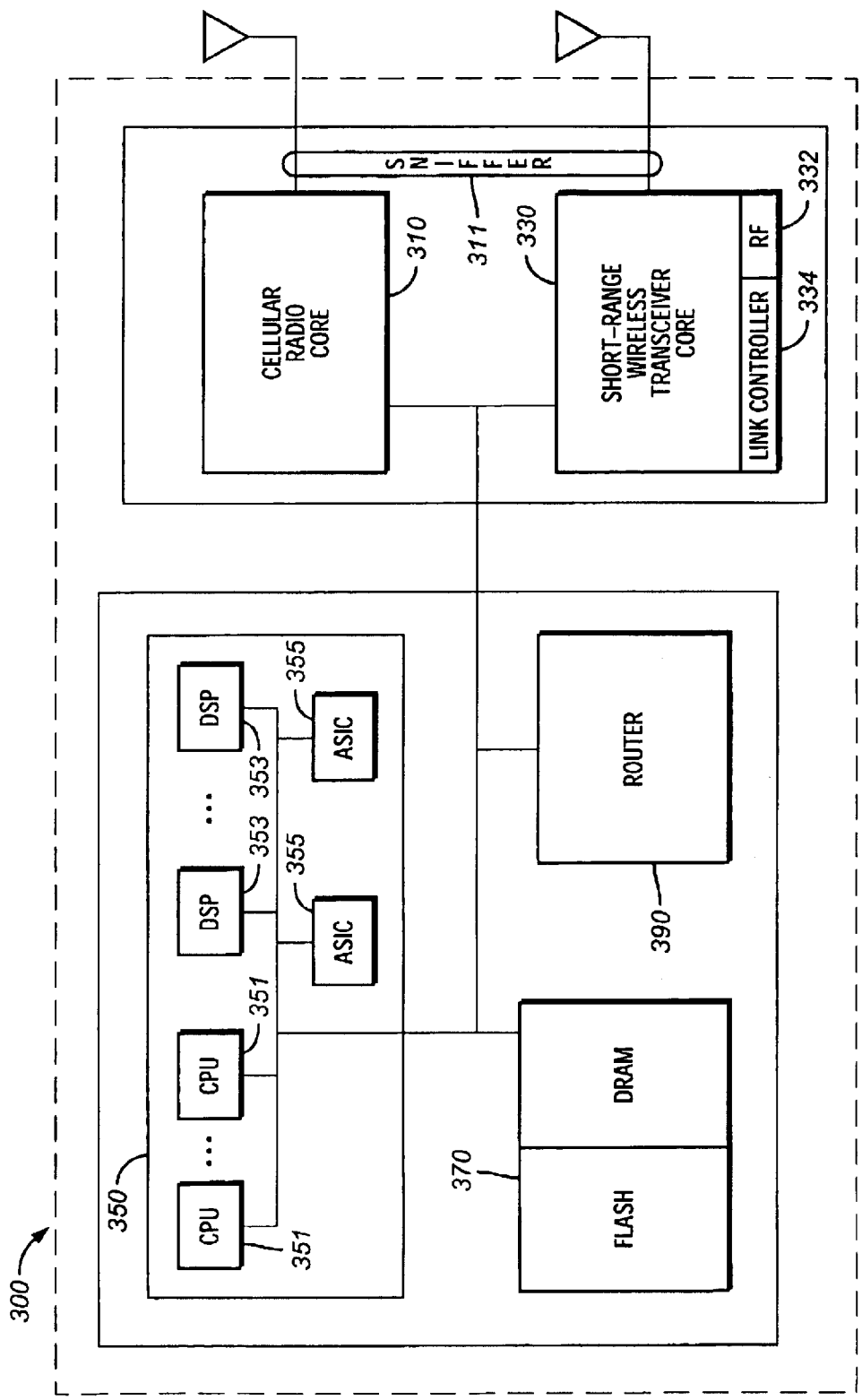
FIG. 4 is a block diagram of a portable appliance using the transistor of FIG. 2.

Thus the invention provides a method and structure for a transistor whose gate is protected from "hot electron injection." Advantageously, the transistor is well-suited for use in a device such as a mixed signal integrated circuit chip, as well as an electronic system including a processor/memory and analog components such as A/D and D/A converters, imagers and RF circuits. The electronic system may also be a portable appliance as shown in FIG. 4. The information handling system 200 deploys transistor devices formed as discussed above. The device has a fast and reliable channel having a long life.

FIG. 4 shows a block diagram of a multi-mode wireless communicator device 300 fabricated on a single silicon integrated chip. In one implementation, the device 300 is an integrated CMOS device with an A/D converter, radio frequency (RF) circuits, including a cellular radio core 310, a short-range wireless transceiver core 330, and an RF sniffer 311, along side digital circuits, including a reconfigurable processor core 350, a high-density memory array core 370, and a router 390. The high-density memory array core 370 can include various memory technologies such as flash memory and static random access memory (SRAM), among others, on different portions of the memory array core. Through the router 390, the multi-mode wireless communicator device 300 can detect and communicate with any wireless system it encounters at a given frequency. The router 390 performs the switch in real time through an engine that keeps track of the addresses of where the packets are going. The router 390 can send packets in parallel through two or more separate pathways.

The reconfigurable processor core 350 controls the cellular radio core 310 and the short-range wireless transceiver core 330 to provide a seamless dual-mode network integrated circuit that operates with a plurality of distinct and unrelated communications standards and protocols such as Global System for Mobile Communications (GSM), General Packet Radio Service (GPRS), Enhance Data Rates for GSM Evolution (Edge) and Bluetooth™. The cell phone core 310 provides wide area network (WAN) access, while the short-range wireless transceiver core 330 supports local area network (LAN) access. The reconfigurable processor core 350 has embedded read-only-memory (ROM) containing software such as IEEE802.11, GSM, GPRS, Edge, and/or Bluetooth™ protocol software, among others.

In one embodiment, the cellular radio core 310 includes a transmitter/receiver section that is connected to an off-chip antenna (not shown). The transmitter/receiver section is a direct conversion radio that includes an I/Q demodulator, transmit/receive oscillator/clock generator, multi-band power amplifier (PA) and PA control circuit, and voltage-controlled oscillators and synthesizers. In another embodiment of transmitter/receiver section 312, intermediate frequency (IF) stages are used. In this embodiment, during cellular reception, the transmitter/receiver section converts received signals into a first intermediate frequency (IF) by mixing the received signals with a synthesized local oscillator frequency and then translates the first IF signal to a second IF signal. The second IF signal is hard-limited and processed to extract an RSSI signal proportional to the logarithm of the amplitude of the second IF signal. The hard-limited IF signal is processed to extract numerical values related to the instantaneous signal phase, which are then combined with the RSSI signal.

For voice reception, the combined signals are processed by the processor core 350 to form PCM voice samples that are subsequently converted into an analog signal and provided to an external speaker or earphone. For data reception, the processor simply transfers the data over an input/output (I/O) port. During voice transmission, an off-chip microphone captures analog voice signals, digitizes the signal, and provides the digitized signal to the processor core 350. The processor core 350 codes the signal and reduces the bit-rate for transmission. The processor core 350 converts the reduced bit-rate signals to modulated signals, for example. During data transmission, the data is modulated and the modulated signals are then fed to the cellular telephone transmitter of the transmitter/receiver section.

Turning now to the short-range wireless transceiver core 330, the short-range wireless transceiver core 330 contains a radio frequency (RF) modem core 332 that communicates with a link controller core 334. The processor core 350 controls the link controller core 334. In one embodiment, the RF modem core 332 has a direct-conversion radio architecture with integrated VCO and frequency synthesizer. The RF-unit 332 includes an RF receiver connected to an analog-digital converter (ADC), which in turn is connected to a modem 316 performing digital modulation, channel filtering, AFC, symbol timing recovery, and bit slicing operations. For transmission, the modem is connected to a digital to analog converter (DAC) that in turn drives an RF transmitter.

According to one implementation, when the short-range wireless core 330 in the idle mode detects that the short-range network using Bluetooth™ signals, for example, have dropped in strength, the device 300 activates the cellular radio core 310 to establish a cellular link, using information from the latest periodic ping. If a cellular connection is established and Bluetooth™ signals are weak, the device 300 sends a deregistration message to the Bluetooth™ system and/or a registration message to the cellular system. Upon registration from the cellular system, the short-range transceiver core 330 is turned off or put into a deep sleep mode and the cellular radio core 310 and relevant parts of the synthesizer are powered up to listen to the cellular channel.

The router 390 can send packets in parallel through the separate pathways of cellular or Bluetooth™. For example, if a Bluetooth™ connection is established, the router 390 knows which address it is looking at and will be able to immediately route packets using another connection standard. In doing this operation, the router 390 pings its environment to decide on optimal transmission medium. If the signal reception is poor for both pathways, the router 390 can send some packets in parallel through both the primary and secondary communication channel (cellular and/or Bluetooth™) to make sure some of the packets arrive at their destinations. However, if the signal strength is adequate, the router 390 prefers the Bluetooth™ mode to minimize the number of subscribers using the capacity-limited and more expensive cellular system at any give time. Only a small percentage of the device 300, those that are temporarily outside the Bluetooth coverage, represents a potential load on the capacity of the cellular system, so that the number of mobile users can be many times greater than the capacity of the cellular system alone could support. All the above implementations have circuits combining low noise devices with high-speed, high-noise digital transistors on the same silicon substrate By using the present invention on the digital transistors closest to the low-noise sections, the impact of the generated noise can be greatly reduced.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A radio frequency transceiver system, comprising:

a transmit chip; and a receive chip adapted to be coupled to the transmit chip, the receive chip having a transistor device comprising:
  a layer of gate oxide on a surface of the semiconductor substrate;
  a gate electrode formed on the surface of the gate oxide, the gate electrode having a drain side;
  a p-well implanted within a semiconductor substrate under the gate electrode;
  an n-well implanted in the p-well on the drain side;
  an n+ source region in the p-well outside of the n-well;
  an n+ drain region within the substrate inside the n-well.

2. The system of claim 1, wherein the n-well extends slightly under the gate electrode.

3. The system of claim 1, further comprising digital circuitry positioned adjacent the device.

4. The system of claim 1, wherein the p-well is deeper than the n-well.

5. The system of claim 1, further comprising a second device, comprising:

a second gate electrode formed on the surface of the gate oxide;

a second n-well implanted within a semiconductor substrate under the second gate electrode;

a p+ source region in the second n-well; and a p+ drain region within the substrate inside the second n-well.

6. The system of claim 5, wherein the second n-well is adjacent the p-well.

7. The system of claim 1, wherein the first and second n-wells are formed at the same time.

8. The system of claim 1, wherein the device is used in a digital circuit adjacent to a CMOS imaging element.

9. The system of claim 1, wherein the device is used in a digital circuit adjacent to a data converter.

10. The system of claim 1, wherein the device is used in a digital circuit adjacent to a radio frequency circuit.

11. A set of radio frequency (RF) integrated circuits, including:

a transmit chip comprising a power amplifier; and a receive chip adapted to be coupled to the transmit chip, comprising:
  one or more low noise amplifiers to receive RF signals, and
  a processor coupled to the low noise amplifiers, the processor transmitting data through the transmit chip and receiving data from the on-chip low noise amplifiers.

12. The set of claim 11, wherein the receive chip further comprises a digitally programmable filter coupled to each low noise amplifier.

13. The set of claim 11, further comprising a mixer coupled to each low noise amplifier.

14. The set of claim 11, further comprising a programmable local oscillator coupled to the processor.

15. The set of claim 11, further comprising:

a PHY coupled to the processor; and a MAC coupled to the PHY.

16. The set of claim 11, wherein the transmit chip further comprises a programmable gain adjustment (PGA) circuit coupled to the processor on the receive chip.

* * * * *